United States Patent
Kevorkian et al.

[19]

[11] Patent Number: 5,936,395
[45] Date of Patent: Aug. 10, 1999

[54] ELECTRO OPTIC VOLTAGE SENSOR WITH OPTIC FIBER

[75] Inventors: Antoine Kevorkian; Dominique Persegol, both of Grenoble; Adrien Danel, Villar Saint Pancrace, all of France

[73] Assignee: Schneider Electric Industries SA, France

[21] Appl. No.: 08/826,375

[22] Filed: Apr. 9, 1997

[30] Foreign Application Priority Data

May 7, 1996 [FR] France ................................. 96 06015

[51] Int. Cl.[6] .................................................. G01R 31/00
[52] U.S. Cl. .......................................... 324/96; 324/244.1
[58] Field of Search ............................ 324/96, 244.1; 250/227.14

[56] References Cited

U.S. PATENT DOCUMENTS

| | | | |
|---|---|---|---|
| 3,810,013 | 5/1974 | Muller | 324/96 |
| 4,269,483 | 5/1981 | Feldkeller | 359/252 |
| 4,516,021 | 5/1985 | Taylor | 324/96 |
| 4,524,322 | 6/1985 | Bobb | 324/72 |
| 5,053,693 | 10/1991 | Bohnert et al. | 324/96 |
| 5,171,981 | 12/1992 | Wood | 250/227.14 |

OTHER PUBLICATIONS

IEEE Transactions on Power Delivery vol. 8, No. 4, Oct. 1993, "Development of an Optical Instrument Transformer for DC Voltage Measurement."

*Primary Examiner*—Ernest Karlsen
*Assistant Examiner*—Russell M. Kobert
*Attorney, Agent, or Firm*—Parkhurst & Wendel, L.L.P

[57] ABSTRACT

A voltage sensor comprises a helicoidal winding formed by an optic fiber having at least one zone sensitive or sensitized to an electrical field having a 2nd order non-linear electro optic effect. The sensitization process of the optic fiber can be achieved by a polarization process under an electric field. The voltage sensor preferably comprises a device enabling the electrical field lines to be homogenized in the region where the helical winding is located. The phase difference induced by the optic wave by electro optic effect caused by the electrical field and representative of the voltage to be measured, can be measured by polarimetric or interferometric detection.

20 Claims, 4 Drawing Sheets

ELECTRO OPTIC VOLTAGE SENSOR WITH OPTIC FIBER

BACKGROUND OF THE INVENTION

The invention relates to an electro optic voltage sensor, comprising means for producing an incident light wave, an electro optic transducer presenting a 2nd order non-linear electro optic effect arranged in an electrical field generated by a voltage to be measured and comprising an input receiving the incident light wave and an output supplying an output light wave, insulating means supporting the transducer, means for opto-electronic detection connected to the output of the transducer, and electronic processing means connected to the means for detection.

The field of non-linear optics involves the non-proportional response of light interacting with matter. A 2nd order non-linear effect is well known wherein wave-mixing of different light frequencies merge to produce other frequencies. Two examples of the 2nd order non-linear effect are the Second Harmonic Generation effect, wherein wave-mixing of two equal fundamental frequencies yield a second harmonic frequency, and the Pockels effect wherein a fundamental frequency is mixed with a d.c. element to change the refractive index of light passing through a material. A Pockels effect linearly advances or retards the refractive index of light waves in a manner directly proportional to the intensity of an applied electric field.

Known electro optic voltage sensors generally use as transducer a crystal sensitive to the electrical field. Such crystals present a 2nd order non-linear electro optic effect, of the Pockels effect type. The galvanic isolation is limited by the small dimensions of the transducer crystal, typically about one centimeter. These sensors are consequently not suitable for measuring very high electrical voltages, of several hundred kilovolts for example. For reasons of dielectric strength of the transducer material, it is not possible to apply the whole voltage to be measured to the terminals of the crystal. For measuring high voltages, sensors of this type are consequently combined with voltage dividers.

An electro optic sensor for measuring a voltage at 345 kV without a voltage divider has been described in the article "Application of an electro optic voltage transducer at 345 kV" presented at "EPRI, Optical sensors for Utility T & D Applications Workshop, Portland, Oreg., Jul. 20–21, 1995". In this sensor, the transducer is formed by a special crystal, of large dimensions, presenting a longitudinal electro optic effect. A crystal of large dimensions is costly and the insulation distance of the head of the sensor is equal to the size of the transducer crystal, which requires a complex and costly implementation to achieve the dielectric strength of the sensor in a high voltage environment.

SUMMARY OF THE INVENTION

The object of the invention is to achieve an electro optic voltage sensor which does not present the shortcomings of known sensors.

According to the invention, this object is achieved by the fact that the transducer comprises an optic fiber having at least one zone sensitive or sensitized to the electrical field and presenting a 2nd order non-linear an electro optic effect of the Pockels effect type, said fiber being disposed in the form of a winding between two points between which the voltage to be measured is applied. The winding is preferably helicoidal. It can also be formed by a spiral.

According to a development of the invention, the sensor comprises homogenization means for homogenizing the distribution of the electrical field lines in the region where the sensitive zones of the optic fiber are located. The homogenization means comprise, for example, two parallel flat electrodes, to whose terminals the voltage to be measured is applied.

According to another development of the invention, the winding is regular and the fiber comprises principal axes having an appreciably constant orientation with respect to the electrical field. To facilitate this orientation, the optic fiber preferably comprises external means for recognizing the principal axes of the fiber.

The phase difference measurement induced by electro optic effect can be achieved by a polarimetric analysis. The operating point of the sensor is then preferably controlled by means for low-frequency control and monitoring of the polarization state of the light wave.

BRIEF DESCRIPTION OF THE DRAWINGS

Other advantages and features will become more clearly apparent from the following description of different embodiments given as non-restrictive examples only and represented by the accompanying drawings in which.

DETAILED DESCRIPTION OF THE PREFERRED EMBODIMENT

Figure 1:
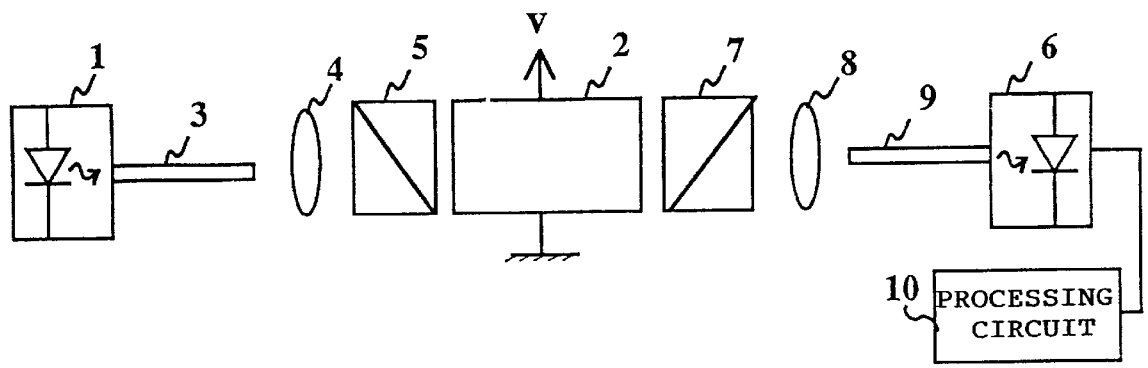
FIG. 1 represents, in schematic form, an electro optic voltage sensor of known type.

The principle of voltage measurement by an electro optic crystal, of known type, is represented in FIG. 1. An optic source 1 supplies a monochromatic light wave. This wave is transmitted to the input of an electro optic crystal 2 by means of an input optic fiber 3, a lens 4 and a polarizing element 5. The light wave passes through the crystal 2 and is transmitted to an opto-electronic detector 6 by means of an analyzer 7, formed by a second polarizing element, a lens 8 and an output optic fiber 9. The voltage V to be measured is applied between two faces of the crystal 2 which are parallel to the direction of propagation of the light in the crystal. An electronic processing circuit 10 is connected to the output of the detector 6.

A sensor of this kind operates in the following manner:

An electrical field $\vec{E}$, created by the voltage V, induces in the crystal 2 an anisotropy proportional to $\|\vec{E}\|$. In FIG. 1, the electro optic effect, or Pockels effect, which is a linear function of the electrical field, is said to be transverse, the electrical field being perpendicular to the direction of propagation of the light in the crystal. The relative phase difference accumulated during propagation in the crystal between the two projections TE and TM of the electrical field of the optic wave on the principal axes of the birefringent crystal is representative of the voltage V applied to the terminals of the crystal. This phase difference is measured polarimetrically by means of the analyzer 7. The intensity of the light wave at the output of the analyzer 7, representative of the phase difference, is transformed into electrical signals by the detector 6, and then transmitted to the processing circuit 10 which supplies a signal proportional to the voltage V to be measured.

When the voltage to be measured is high, this voltage cannot be applied directly to the terminals of the crystal. A voltage divider, either resistive or capacitive, is then used.

The electro optic effect can also be longitudinal. In this case the electrical field induced by the voltage to be measured must be appreciably parallel to the direction of propagation of the light in the crystal.

According to the invention the electro optic crystal is replaced by a sensitive optic fiber. However, an ordinary optic fiber does not present an electro optic effect of 2nd order. It is however possible, notably by means of polarization processes under a field, for example by poling techniques, to sensitize a section of optic fiber in such a way that it presents electro optic properties of 2nd order in a region localized near the core of the fiber.

Figure 2:
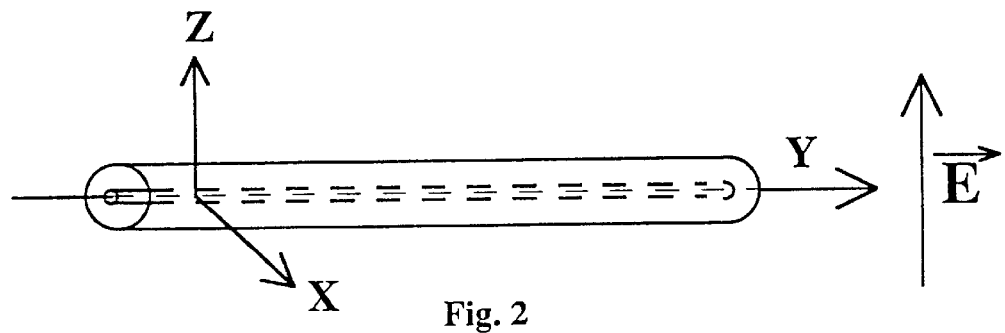
FIG. 2 illustrates a section of sensitive optic fiber arranged in an external electrical field.

In FIG. 2, a section of fiber 11 of longitudinal axis Y, comprises after sensitization treatment according to an axis Z, perpendicular to the axis Y, principal axes X, Y and Z, X and Z defining a plane transverse to the propagation direction of the light (axis Y). In this case the electro optic effect is transverse. The anisotropy induced by electro optic effect depends on the components of the electrical field to be measured according to the principal axes of the sensitive fiber. In the case of FIG. 2, the induced anisotropy is maximum when the electrical field $\vec{E}$ in which the fiber is placed is parallel to the axis Z. The electro optic properties of the fiber are in fact expressed in the form of a tensor, which in the XYZ axis system is written:

$$[r] = \begin{bmatrix} 0 & 0 & r_{13} \\ 0 & 0 & r_{13} \\ 0 & 0 & r_{33} \\ 0 & r_{13} & 0 \\ r_{13} & 0 & 0 \\ 0 & 0 & 0 \end{bmatrix} \text{ with } r_{33} = 3r_{13} \quad (1)$$

Application of an external electrical field $\vec{E}$ oriented according to Z leads to a maximum variation of the refractive index of the fiber. This variation is equal respectively for each axis to:

$$\Delta n_x = \frac{1}{2} r_{13} n^3 \|\vec{E}\| \quad (2)$$

$$\Delta n_z = \frac{1}{2} r_{33} n^3 \|\vec{E}\| = 3\Delta n_X \quad (3)$$

where n is the mean refractive index of the fiber and $\vec{E}$ is the external electrical field at the level of the core of the fiber.

In the case where the axis Z of the sensitive fiber and the external field do not have the same orientation, the index variation of the fiber is not maximum and the ellipsoid of the indexes resulting from the electro optic effect no longer has the orientation XYZ. However, if the sensitive fiber has a strong intrinsic birefringence (HiBi fiber), for a misalignment lower than 90°, the ellipsoid of the indexes keeps the axes XYZ and the index variations on the axes X and Z are given by the equations (2) and (3) where $\|\vec{E}\|$ replaced by Ez, Ez being the component according to Z of the external electrical field. Consequently, a sensitive optic fiber with a high intrinsic birefringence will preferably be used.

The ideal transducer comprises an optic fiber uniformly sensitized over its whole length.

As the voltage corresponds to the integral of the electrical field between the points between which the voltage is applied, the phase difference is directly representative of the voltage when the light wave covers the whole of the distance comprised between these points, i.e. if the ends of the transducer are placed as close as possible to these two points. If the transducer presents a longitudinal electro optic effect, it is then preferably arranged according to a straight line joining the two points between which the voltage to be measured is applied. If, on the other hand, the transducer presents a transverse electro optic effect, as is the case of the fiber according to FIG. 2, it is the components of the field situated in the plane perpendicular to the light propagation axis Y which are responsible for the anisotropy induced by electro optic effect. The fiber can then not be disposed parallel to the field according to the straight line joining the two points.

Figure 3:
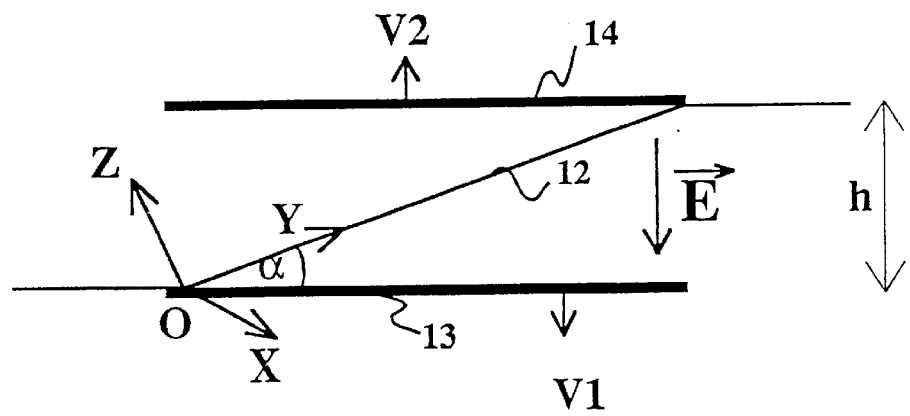
FIG. 3 represents a fiber transducer of linear form.

According to a first embodiment represented in FIG. 3, an optic fiber 12 sensitized according to the axis Z, uniformly over its whole length, presents a transverse electro optic effect. It constitutes a linear transducer. A uniform field $\vec{E}$ is created between two parallel flat electrodes 13 and 14, at different potentials, for example V1 and V2 respectively. The electrodes are placed at a distance h from one another. To measure the voltage V=V2−V1, the fiber 12 is disposed according to a straight line between the two flat electrodes, with a predetermined slope, the fiber forming a constant angle α with the electrodes. In FIG. 3, the fiber is disposed in such a way that the field $\vec{E}$ is in the plane formed by its principal axes Y and Z. In the plane ZX, the field $\vec{E}$ then comprises a single component Ez, which is not zero, responsible for the anisotropy induced by electro optic effect. L being the length of the section of fiber arranged between the electrodes, it can be shown that between the two ends of the fiber, the total phase difference between two orthogonal components of a light wave of wave length λ, linked to the index variation of the sensitive fiber due to the electrical field, is expressed respectively for the two waves polarized according to the axes X and Z by:

$$\Phi_X = \frac{2\pi}{\lambda} \frac{1}{2} r_{13} n^3 \int_0^L Ez(Y) dY \quad (4)$$

$$\Phi_Z = \frac{2\pi}{\lambda} \frac{1}{2} r_{33} n^3 \int_0^L Ez(Y) dY \quad (5)$$

However for a section of elementary fiber dl, the component Ez can be expressed in terms of the local field $\vec{E}$ (1) at the point l considered (0≦l≦L) by:

$$(6) \quad Ez = \|\vec{E}(1)\| \cos \alpha$$

l varying from 0 to L between the ends of the section of fiber situated between the electrodes. A ratio k is defined equal to L/h, so that the equations (4) and (5) can be written:

$$\Phi_x = \frac{\pi}{\lambda} r_{13} n^3 k \cos\alpha \int_0^h \|\vec{E}(l)\| dl \quad (7)$$

$$\Phi_z = \frac{\pi}{\lambda} r_{33} n^3 k \cos\alpha \int_0^h \|\vec{E}(l)\| dl \quad (8)$$

i.e.:

$$\Phi_X = \frac{\pi}{\lambda} r_{13} n^3 k \cos\alpha (V2 - V1) \quad (9)$$

$$\Phi_Z = \frac{\pi}{\lambda} r_{33} n^3 k \cos\alpha (V2 - V1) \quad (10)$$

But $r_{33} = 3 r_{13}$ (see equation (1)).

At the output of the fiber, the total electro optic phase difference between the components of the light wave according to the axes X and Z can therefore be written $$\Phi eo = \Phi_Z - \Phi_X = \frac{2\pi}{\lambda} r_{13} n^3 k \cos\alpha (V2 - V1) \quad (11)$$

Thus, the phase difference induced by electro optic effect between the components of the optic wave according to the axes X and Z (principal axes of the fiber) is directly proportional to the potential difference (V2−V1) to be measured when the fiber is disposed with a constant slope and orientation with respect to the electrical field $\vec{E}$.

Figure 4:
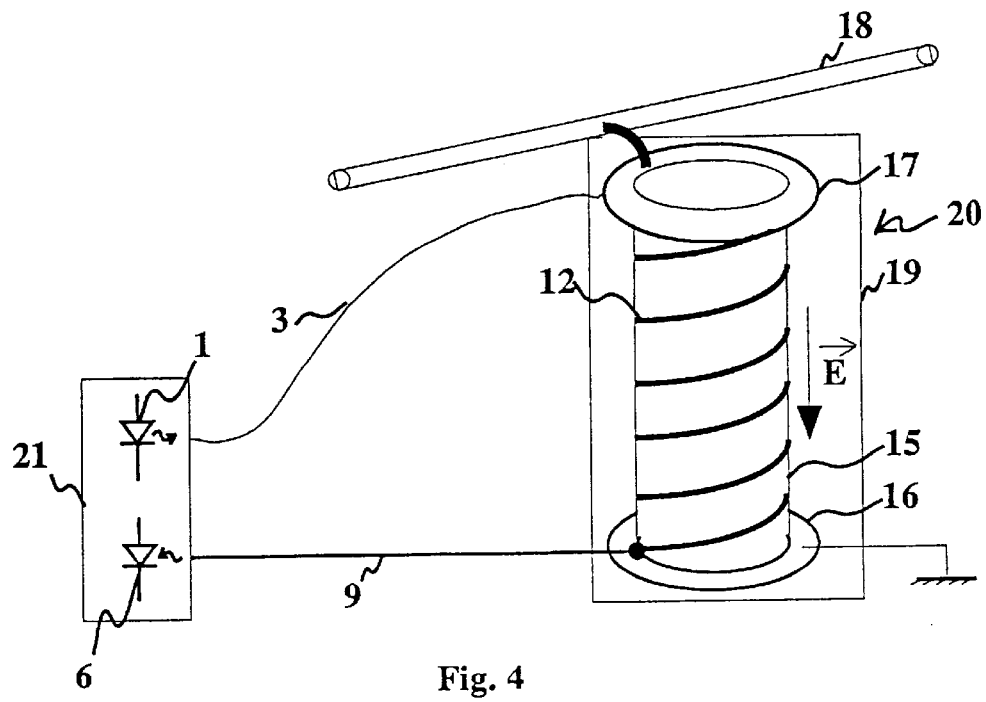
FIG. 4 represents a particular embodiment of a transducer used in a sensor according to the invention.
Figure 6:
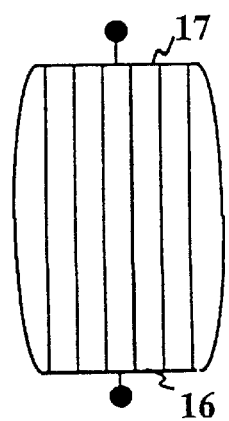

According to a preferred embodiment represented in FIG. 4, the sensitive fiber constitutes a transducer of helicoidal shape. The optic fiber 12, sensitized according to the axis Z uniformly over its whole length, is coiled on a dielectric cylinder 15. Two circular-shaped flat electrodes 16 and 17 are arranged at the two ends of the cylinder. The voltage to be measured is applied between the two electrodes, the electrode 16 being for example earthed and the electrode 17 connected to a high voltage line 18. The diameter of the electrodes is slightly greater than that of the cylinder. Thus, in the region where the cylinder, and consequently the sensitive fiber, is located, the distribution of the field lines is almost uniform (see FIG. 6). The fiber is coiled regularly along the cylinder and the orientation of its principal axes is appreciably constant with respect to the electrical field $\vec{E}$. In this case, the preceding formulas remain applicable and the phase difference induced by electro optic effect is proportional to the integral of the electrical field, and therefore to the voltage to be measured. Polarizing elements, not represented, are disposed on input and on output of the transducer in order to polarize the incident light wave in appropriate manner and to analyze the output light wave of the transducer. A dielectric enclosure 19 protects the whole of the head of the sensor 20. A measuring and monitoring unit 21, comprising notably the light source (1) and the means for detection (6) and electronic processing, are preferably located away from the head of the sensor to which they are connected by input 3 and output 9 optic fibers. The links between the sensitive fiber 12 and the fibers 3 and 9 can be achieved respectively at the two ends of the cylinder by simple optic connections.

Figure 5:
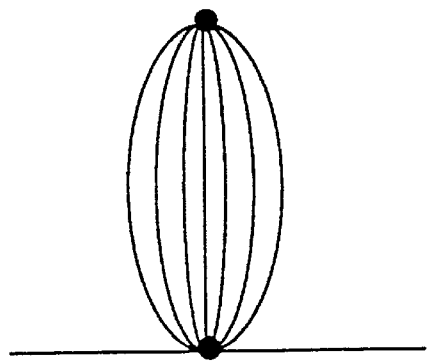
FIGS. 5 and 6 represent the field lines between two conductors, respectively in the absence and in the presence of flat electrodes.

The phase difference induced by electro optic effect is proportional to the number of turns of the winding. The dielectric cylinder 15 can act as support for the electrodes 16 and 17. The function of the electrodes 16 and 17 is more particularly illustrated by FIGS. 5 and 6. In FIG. 5, in the absence of the electrodes, the field lines between two points at different potentials are not straight. If a sensitive fiber is placed in this zone, its orientation with respect to the electrical field varies from one point to the other. Due to the flat electrodes 16 and 17 (FIG. 6) there is homogenization of the field lines. The direction of the field lines is almost uniform between the electrodes which constitute a flat capacitor in which the winding is placed and in which the electrical field lines are appreciably parallel to the axis of the winding. The direction of the electrical field being constant, it is then possible to arrange a sensitive optic fiber in this field with a pre-determined orientation of the principal axes of the fiber with respect to the field.

Figure 7:
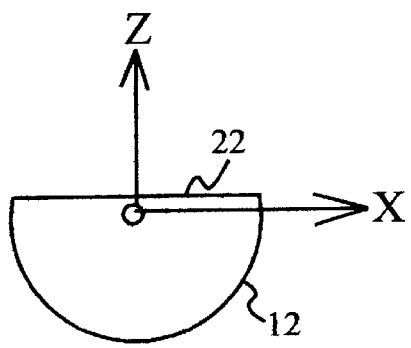
FIG. 7 represents, in cross-section, an optic fiber comprising a flat part.

According to a particular embodiment, represented in FIG. 7, the optic fiber comprises a longitudinal flat part 22. The flat part 22 has a predetermined orientation with respect to the principal axes of the fiber. In the figure the flat part 22 is perpendicular to the sensitization axis Z of the fiber. Thus, when the fiber 12 is wound on the dielectric cylinder 15, it is easier to ensure that the principal axes of the fiber are kept in a predetermined constant orientation with respect to the axis of the winding, i.e. with respect to the axis of the cylinder and with respect to the direction of the electrical field.

Any method of analysis of a variation of the state of a light wave on output from the transducer, linked to the variation of the index of the sensitive zone, or sensitive zones, of the transducer can be used. Interferometric or polarimetric detection methods, of conventional type, can for example be used.

As a non-restrictive example, a particular embodiment of the voltage sensor, using a polarimetric method of analysis, will be described in greater detail with respect to FIG. 8.

As in FIG. 4, the sensor comprises a sensor head 20 and a measuring and monitoring unit 21 connected to the sensor head 20 by optic fibers. The transducer, which is preferably of the type represented in FIG. 4, is represented in schematic manner at 23 inside the sensor head 20.

The optic source 1, arranged in the unit 21, supplies a light wave of wavelength $\lambda$ and intensity lo. The optic source 1 is connected to a polarizing fiber 24. A linearly polarized light is thus obtained at the output of the polarizing fiber, at A. The point A is connected by an input fiber 3 to the transducer 23. In FIG. 8, the fiber 3 is a polarization maintaining fiber whose principal axes coincide with those of the sensitive fiber.

The output of the transducer 23 is connected to an input B of the analyzer 7. The set of fibers connected between the points A and B therefore form an oriented system. In the embodiment of FIG. 8, the analyzer is located in the sensor head 20 and supplies light signals on two separate analysis channels. The analyzer 7 is connected by output fibers 9a and 9b to an opto-electronic detection 6 system located in the unit 21. The fibers 9a and 9b can be standard multimode fibers. The detection system 6 comprises two elementary detectors 6a and 6b, each associated to an analysis channel and supplying respectively electronic signals la and lb to the processing circuit 10.

Between the points A and B the two components of the optic wave according to the principal axes of the oriented system undergo a phase difference Φtotal constituted by the combination of the electro optic phase difference Φeo and an intrinsic phase difference Φi due to the intrinsic birefringence of the fibers of the oriented system. When the alignment criteria between the principal axes of the sensitive fiber 12 and the field $\vec{E}$ are respected, these phase differences are added together:

(12) $\Phi total = \Phi i + \Phi eo$ $\Phi eo$ is proportional to the voltage to be measured, according to the equation (11), and $\Phi i$ can be written:

(13) $\Phi i = \delta \beta i L_{AB}$ where $\delta \beta i$ is the intrinsic birefringence of the fibers and $L_{AB}$ the length of the fibers, between A and B.

To maximize the sensitivity of the phase difference measurement, the incident light wave is linearly polarized at A at 45° of the principal axes of the oriented system. The linearity and sensitivity of measurement then depend on the polarization state of the light wave at the point B, itself dependent both on the initial polarization state at the point A and on the intrinsic birefringence of the oriented system.

The voltage to be measured being of the AC voltage type, the phase difference $\Phi eo$ can be written in the form:

(14) $\Phi eo = K \sin \omega t$ $\omega$ being the angular frequency of the voltage (V2–V1), generally of about 50 Hz or 60 Hz frequency.

The detectors 6a and 6b each deliver an electrical signal proportional to the light intensity received, of the form:

(15) $I = \gamma^{I_0/2}[1 + \sin 2\Theta \cos(F_i + K\sin\omega t)]$ where $\theta$ is the orientation of the analyzer for each analysis channel, an orientation expressed in the XZ system of principal axes of the sensitive fiber. $\gamma$ is a term representative of the optic losses, localized or distributed, occurring in the course of propagation of the light wave between the source 1 and the analyzer 7.

In the embodiment represented, $\theta a = 45°$ for a first analysis channel and $\theta b = 135°$ for a second analysis channel. This can be achieved, in conventional manner, by means of an analyzing cube or with a Y-shaped coupler, and two analyzers.

Then $\sin 2\theta = \pm 1$. If the intrinsic birefringence is moreover such that $\Phi i = (2p+1) \pi/2$, with p being an integer, then the variations of Ia and Ib due to the electro optic effect are maximum. In fact, for the two analysis channels, the equation (15) is written respectively:

$$Ia = \gamma \frac{I_o}{2}[1 + \sin(K\sin wt)] \quad (16)$$

$$Ib = \gamma \frac{I_o}{2}[1 - \sin(K\sin \omega t)] \quad (17)$$

Figure 8:
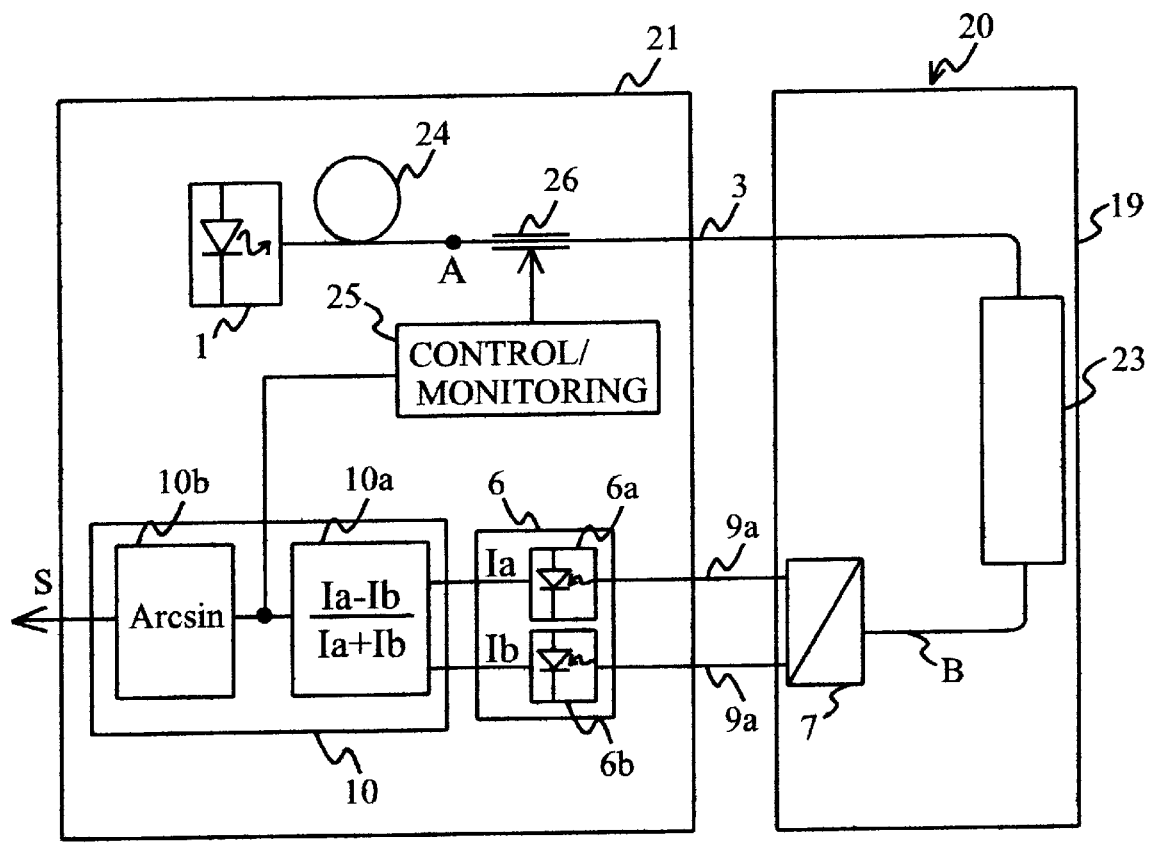
FIG. 8 represents a particular embodiment of a sensor according to the invention.

The processing circuit 10 of FIG. 8 enables variations of the intensity Io of the optic source 1 to be eliminated. It receives on input the signals Ia and Ib and calculates the ratio:

(18) $(Ia-Ib)/(Ia+Ib) = \sin(K\sin\omega t) = \sin \Phi eo$

This ratio is quite independent from the value $I_o$. Then the processing circuit 10 performs the Arcsin function and consequently supplies a signal S representative of the electro optic phase difference $\Phi eo$, and therefore of the voltage to be measured.

The hypothesis used above for the value of $\Phi i$ enables an optimum value of $\Phi eo$ in terms of linearity and sensitivity to be obtained. Yet the intrinsic birefringence is however, in reality, variable over time. This variation, which is a function of the external constraints applied to the sensor, such as temperature, mechanical vibrations, etc., is a slow variation with respect to the variation frequency (about 50 Hz) of $\Phi eo$ The variations of $\Phi i$ take place slowly over time at a frequency f<<50 Hz.

According to the preferred embodiment, represented in FIG. 8, the operating point of the sensor is stabilized so as to guarantee at all times the most favorable conditions in terms of sensitivity and linearity of measurement. This is achieved, in FIG. 8, by a low-frequency servocontrol of $\Phi i$ so that $\Phi i = (2p+1) \pi/2$. This condition results at rest, i.e. for a voltage to be measured which is nil, and therefore a zero phase difference $\Phi eo$, in a perfectly circular polarization state at B. The intensities analyzed at different angles by the analyzer 7 are then identical and the signals used to extract S can be used for servocontrol of the operating point of the sensor. A polarization state control and monitoring circuit 25, connected to the processing circuit 10, commands a regulating device 26 of the intrinsic phase difference $\Phi i$ between the points A and B. The device 26 acts by deformation of a localized zone of one of the fibers of the oriented system. In FIG. 8, the deformed zone is situated on the polarization maintaining input optic fiber 3 connected to the sensitive fiber 12. It is also possible to act on a fiber connected on output of the sensitive fiber, or directly, in the transducer, on the sensitive fiber. The embodiment represented in FIG. 8 is preferred in so far as it enables the sensor head 20 to be totally electrically isolated from the unit 21, thus achieving galvanic isolation between the electronics and the sensor head.

In FIG. 8, the processing circuit 10 comprises two distinct circuits 10a and 10b, connected in series and performing respectively the functions (Ia–Ib)/(Ia+Ib) and Arcsin. The control and monitoring circuit 25 is connected to the output of the circuit 10a and controls the device so that the low-frequency (f<<50 Hz) components of Ia and Ib are identical, i.e. the low-frequency component of (Ia–Ib) is zero.

The invention is not limited to the particular embodiments described and represented herein.

Thus, the ideal transducer comprises an optic fiber sensitized in uniform manner over its whole length. However, for reasons of ease of manufacture, the transducer may comprise several sensitive zones, preferably adjoining and of the same sensitivity. It can also be formed by an assembly of elementary fibers, comprising sensitive zones, arranged end to end. In all cases the principal axes of all the fiber elements are to be aligned in such a way as to preserve an assembly having defined principal axes.

In order to achieve as best as possible the integral of the electrical field radiated between two points between which the voltage to be measured is applied, the ends of the transducer are positioned as close as possible to these points. Nevertheless, for reasons of practical implementation, the transducer can be disposed in such a way as to perform only a part of the integral of the radiated field. In this case the transducer is preferably disposed in the regions where the field is the largest so as to limit measurement error.

In FIG. 8, the oriented system comprising fixed principal axes goes from the point A, situated in the unit 21, to the point B situated in the sensor head. The analyzer 7 can if required be located in the unit 21. In this case the output signal of the transducer 23 is transmitted to the unit 21 by a fiber which must have the principal axes of the oriented system. This can be achieved by a polarization maintaining fiber connected to the output of the transducer or by a non-sensitized part of the sensitive fiber 12 forming the transducer.

The point A can also be located in the sensor head 20. In this case the input optic fiber 3 can be of standard type. The orientation condition of the polarized wave at 45° with respect to the principal axes of the transducer can then be achieved at the point A by a suitable delocalized active monitoring system located upstream from the point A and from the input fiber 3, in the unit 21. In this case dual servocontrol is performed so as to guarantee both the condition for input of a wave polarized at 45° and monitoring of the operating point, this twofold condition then always resulting in a perfectly circular state on output for a zero applied voltage.

In the above description, servocontrol of the operating point is achieved by control of the intrinsic phase difference. The polarization state on output from the transducer is a function of the electro optic phase difference to be measured, of the phase difference due to the intrinsic birefringence of the fibers and of the polarization state of the optic wave at the input of the transducer. The variations of the voltage to be measured, and therefore of the electro optic phase difference, have a frequency greater than the variations of the other factors. Thus, servocontrol of the operating point acts on the polarization state of the optic wave at the input of the transducer.

Analysis of the electro optic phase difference can be performed by means of an interferometric method in white light. In this case, the source 1 is a polychromatic source and analysis consists in recognition of the interference spectrum.

Figure 9:
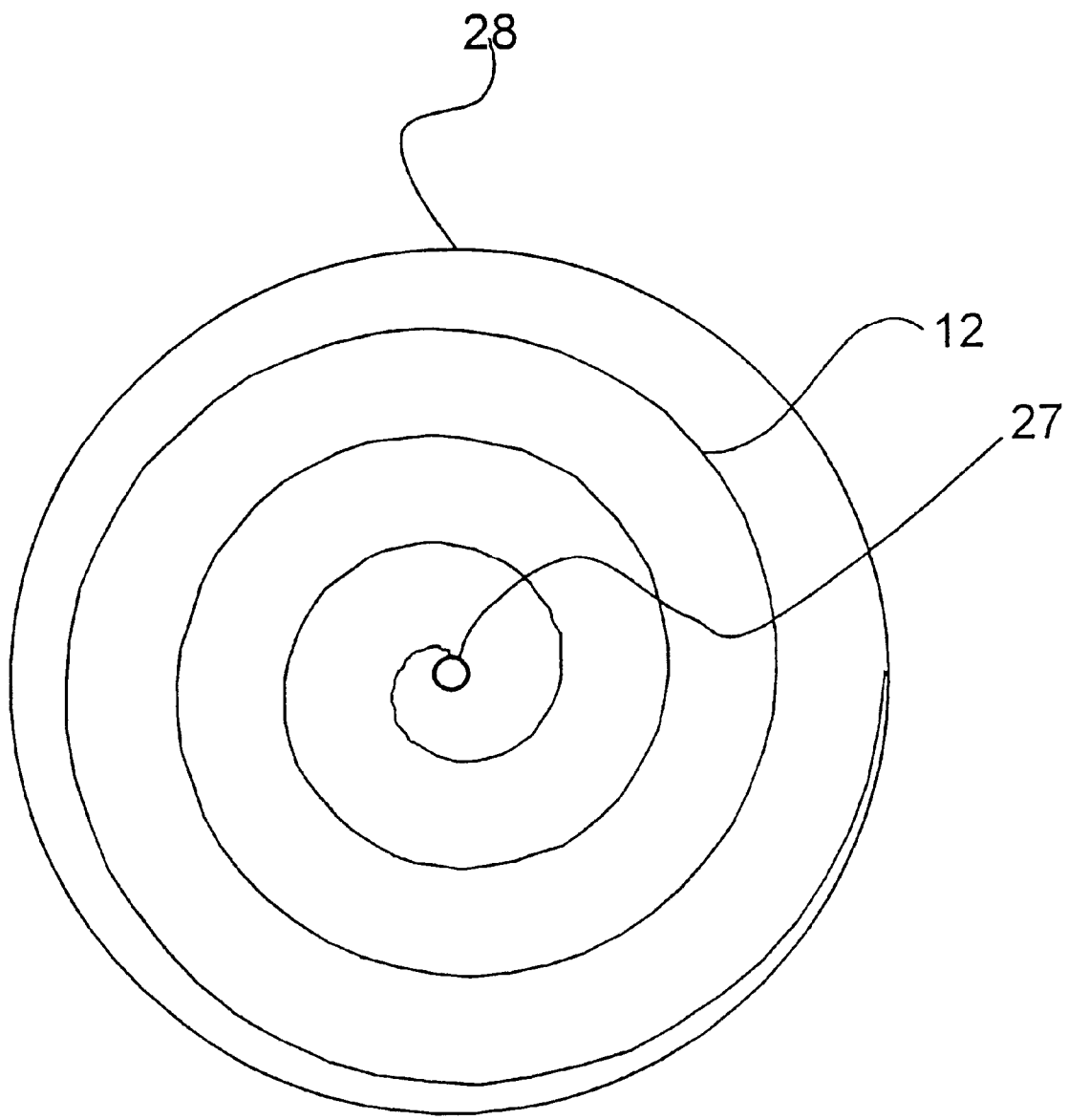
FIG. 9 illustrates a winding in the form of a spiral.

In FIG. 4, the fiber winding is a helicoidal type winding. The invention is however in no way limited to this type of winding. As an example, to measure the voltage between a central conductor 27 and a cylindrical enclosure 28 in a metalclad cubicle, the fiber 12 is preferably arranged in a spiral between the conductor and the enclosure (FIG. 9).

We claim:

1. An electro optic voltage sensor, utilizing the Pockels effect, comprising:

means for producing an incident light wave, an electro optic transducer providing a 2nd order non-linear electro optic effect, said electro optic transducer being arranged in an electric field generated by a voltage to be measured and comprising an input receiving the incident light wave and an output supplying an output light wave, insulating means for support of said electro optic transducer, means for opto-electronic detection connected to the output of said electro optic transducer, electronic processing means connected to said means for opto-electronic detection, and wherein said electro optic transducer comprises an optic fiber having at least one zone sensitized to the intensity of the electrical field and presenting a 2nd order non-linear electro optic effect, said optic fiber being disposed in the form of a winding between two points between which the voltage to be measured is applied.

2. The sensor according to claim 1, wherein said winding is a helicoidal winding.

3. The sensor according to claim 1, wherein said winding is formed by a spiral.

4. The sensor according to claim 1, comprising homogenization means for homogenizing the distribution of the electrical field lines in the region where the sensitive zones of the optic fiber are located.

5. The sensor according to claim 4, wherein the homogenization means comprise two parallel flat electrodes and terminals to which the voltage to be measured is applied.

6. The sensor according to claim 1, wherein said optic fiber is sensitized to the electrical field in continuous and uniform manner over its whole length.

7. The sensor according to claim 1, wherein said ends of the optic fiber are placed as close as possible to the two points between which the voltage to be measured is applied.

8. The sensor according to claim 1, wherein said optic fiber is formed by an assembly of elementary fibers comprising sensitive zones arranged end to end.

9. The sensor according to claim 1, wherein said sensitive zones of the optic fiber are sensitized by a polarization process under a field.

10. The sensor according to claim 1, wherein said winding is regular and said optic fiber comprises principal axes having an appreciably constant orientation with respect to the electrical field.

11. The sensor according to claim 10, wherein said optic fiber comprises external means for recognizing the principal axes of said optic fiber.

12. The sensor according to claim 11, wherein the means for recognizing the principal axes of said optic fiber comprise a longitudinal flat part having a predetermined orientation with respect to the principal axes of said optic fiber.

13. The sensor according to claim 1, wherein said insulating means for support of the transducer comprise a dielectric cylinder on which said optic fiber is wound.

14. The sensor according to claim 13, wherein said dielectric cylinder supports at its ends circular flat electrodes whose diameter is larger than the diameter of the cylinder and between which the voltage to be measured is applied.

15. The sensor according to claim 1, wherein said optic fiber has a high intrinsic birefringence.

16. The sensor according to claim 1, wherein said means for producing the incident light wave comprise polarization means, and said means for opto-electronic detection comprise means for polarimetric analysis of the light wave output from the transducer.

17. The sensor according to claim 16, comprising means for low-frequency control and monitoring of the polarization state of the light wave in order to servocontrol an operating point of the sensor.

18. The sensor according to claim 17, wherein said means for control and monitoring of the polarization state are connected to the output of said means for opto-electronic detection.

19. The sensor according to claim 17, wherein said means for control and monitoring of the polarization state comprise means for deforming a localized zone of the transducer.

20. The sensor according to claim 17, wherein said means for control and monitoring of the polarization state includes means for deforming a second optic fiber connected in series with said optic fiber between said means for producing the incident light wave and said means for opto-electronic detection.

* * * * *